(12) United States Patent
Kitch et al.

(10) Patent No.: US 6,277,726 B1
(45) Date of Patent: Aug. 21, 2001

(54) METHOD FOR DECREASING CONTACT RESISTANCE OF AN ELECTRODE POSITIONED INSIDE A MISALIGNED VIA FOR MULTILEVEL INTERCONNECTS

(75) Inventors: Vassili Kitch, San Ramon; Michael E. Thomas, Milpitas, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/208,202

(22) Filed: Dec. 9, 1998

(51) Int. Cl.[7] .............................................. H01L 21/4763
(52) U.S. Cl. ........................ 438/618; 438/622; 438/624; 438/631; 438/669; 438/637; 438/625; 257/758; 156/643
(58) Field of Search ...................... 438/618, 622, 438/624, 631, 669, 637, 625; 156/643; 257/758

(56) References Cited

U.S. PATENT DOCUMENTS

| | | | |
|---|---|---|---|
| 4,917,759 | * 4/1990 | Fisher et al. ........................ | 156/643 |
| 5,420,078 | * 5/1995 | Sikora ................................ | 437/228 |
| 5,534,462 | * 7/1996 | Fiordalice et al. ................... | 437/190 |
| 5,656,543 | * 8/1997 | Chung ................................ | 438/625 |
| 5,656,861 | * 8/1997 | Godinho et al. ..................... | 257/758 |
| 5,702,981 | * 12/1997 | Maniar et al. ....................... | 437/192 |
| 5,798,299 | * 8/1998 | Chung ................................ | 438/625 |
| 5,801,093 | * 9/1998 | Lin ..................................... | 438/624 |

OTHER PUBLICATIONS

S. Wolf, Silicon Processing for the VLSI Era, vol. 1, Process Technology, Mar. 1986.*

* cited by examiner

*Primary Examiner*—Matthew Smith
*Assistant Examiner*—Belur Keshavan
(74) *Attorney, Agent, or Firm*—Skjerven Morrill MacPherson LLP; Edward C. Kwok

(57) ABSTRACT

A method for removing a resistive film formed on an electrode to increase the conductive contact area of the electrode positioned in a misaligned contact hole. The method comprises providing a substrate supporting an electrode layer. The electrode layer is etched to produce metal lines. During the processing of the metal lines, a resistive film is formed thereon. The resistive film is removed and a protective barrier is formed on the metal lines. A dielectric layer is formed on the substrate, including the metal lines. The dielectric layer is subsequently patterned to form contact holes or vias to expose a portion of the metal lines. The contact holes are filled with plugs such that a second electrode layer can be formed on the dielectric layer and the plugs.

42 Claims, 7 Drawing Sheets

METHOD FOR DECREASING CONTACT RESISTANCE OF AN ELECTRODE POSITIONED INSIDE A MISALIGNED VIA FOR MULTILEVEL INTERCONNECTS

BACKGROUND OF THE INVENTION

1. Field of the Invention

This invention relates to a method of fabricating an integrated circuit and more specifically to a method for reducing the resistance of electrical coupling between conductive layers in vias or contact holes.

2. Background of the Invention

Several factors adversely impact the effectiveness of multilevel interconnects. Among them include, but are not limited to, misalignment of vias or contact holes caused by the via patterning process and the failure to remove resistive compounds formed on electrodes positioned in the misaligned contact holes. These two factors cause an increase in resistance of the contact holes, resulting in poor conduction between the levels of the interconnect. Consequently, the reliability of the produced device is diminished. As VLSI feature sizes continues to shrink, for example to sub 0.25 $\mu$m region, the problem of misaligned or "unlanded" vias seem unavoidable. Thus, to improve device performance and reliability, as related to conduction between conductive layers, it would be desirable to reduce or eliminate the presence of the aforementioned resistive compounds.

To pose the problem more concretely by way of example, aluminum (Al) is a preferred material for electrodes because it is lightweight, corrosion resistant, and inexpensive. However, aluminum is porous and has a high effective surface area capable of easily adsorbing oxygen and water vapor. As a result, during the processing of multilevel interconnects, a native oxide layer is formed on the aluminum. The oxidized aluminum acts as a resistive film.

As discussed above, the problem of conductivity is also heightened due to the misalignment of vias or contact holes. Ideally, as illustrated in FIG. 1, the vias 2 should be positioned directly above the aluminum electrodes 4, as depicted by area X. Referring to FIG. 1, there is illustrated a substrate 6 supporting the electrodes 4. An intermediate dielectric layer 8 separates the electrodes 4 from a second level of interconnect 10. The direct alignment of tungsten (W) filled vias 2 on the aluminum electrodes 4 can provide a resistance of about 1 Ω to about 2 Ω for the contact holes 2. When the tungsten filled vias 2 are misaligned or "unlanded," generally illustrated by area Y in FIG. 2, the resistance of the contact holes can increase, causing the reliability of the device to suffer.

The combination of having an oxidized aluminum electrodes 4 and misaligned tungsten filled vias 2, therefore, can produce a resistance about 8–10 Ω, for the contact holes 2. This combination is illustrated in FIG. 2. In order to compensate for the increase in resistivity caused by the misalignment of the contact holes 2, the resistance of the aluminum electrode 4 has to be decreased. Therefore, the active conductive contact area (i.e., the area not covered by native oxide) of the aluminum electrode 4 must be enlarged. The only active contact area of aluminum electrode 4 is area D, an area which is typically covered by titanium nitride 5. It is desirable to remove the oxidized aluminum film, as illustrated by shaded area 7, from the aluminum electrode 4, and in effect, to make contact area C active. The activation of contact area C produces a resistivity of about 2 Ω to about 3 Ω for the "unlanded" tungsten filled contact holes 2, a decline of about 5 Ω to about 8 Ω.

SUMMARY OF THE INVENTION

The present invention accomplishes its desired objects by broadly providing a method for decreasing contact resistance of an electrode, comprising:

a) providing an electrode having a resistive film formed thereon;

b) removing the resistive film from the electrode; and c) forming a protective layer on the electrode.

The electrode can comprise an aluminum layer supported by a titanium nitride layer or a titanium/titanium nitride bi-layer. The resistive film may comprise native oxide, formed on the electrode during etching or processing of the electrode. The removing step (b) comprises employing a plasma of an etchant gas to etch and remove the resistive film from the electrode. The etchant gas includes about 100% by volume argon.

After the resistive film has been removed from the electrode, a protective layer is formed on the electrode. Preferably, the protective layer comprises titanium nitride. Alternatively, the protective layer may comprise a titanium/titanium nitride stack.

The present invention also accomplishes its desired objects by broadly providing a method for manufacturing a multilevel interconnect, comprising:

a) providing a first electrode layer on a substrate;

b) removing a portion of the first electrode layer from the substrate to produce metal lines, the metal lines having a resistive film formed thereon during processing of the metal lines;

c) etching the metal lines of step (b) including employing a plasma of an etchant gas to remove the resistive film;

d) forming a protective layer on the substrate and the metal lines, the protective layer having intermediate portions;

e) etching the intermediate portions of the protective layer to break through and remove the intermediate portion from the substrate;

f) forming a dielectric layer on the substrate and the metal lines;

g) etching vias in the dielectric layer to expose a portion of the metal lines;

h) filling the vias with plugs; and i) forming a second electrode layer on the dielectric layer and the plugs to produce a multilevel interconnect.

The first electrode layer, as discussed above, comprises a titanium nitride layer supporting an aluminum layer. The first electrode layer may additionally comprise a titanium layer disposed under the titanium nitride layer. The first electrode layer may additionally comprise a second titanium nitride layer disposed on the aluminum layer. Selected portions of the first electrode layer is etched or removed from the substrate to form metal lines. During the processing of the metal lines, a resistive film, such as native oxide, is formed on the metal lines. In other words, a portion of the aluminum is oxidized. As stated previously, the resistive film is etched from the metal lines by employing a plasma of an etchant gas comprising about 100% by volume argon.

As discussed previously, after the resistive film has been removed from the metal lines, a protective layer is formed on the metal lines, including the substrate. The protective layer that is formed on an intermediate portion, i.e., the space between the metal lines, is etched and removed from the substrate. The protective layer that is formed on top of the metal lines is also removed. In the alternative embodiment, the protective layer that is formed on the second titanium nitride layer on top of the metal lines is removed.

A first level of the multilevel interconnect is now in condition for the addition of the next level. A dielectric layer is formed on the substrate and the metal lines. The dielectric layer may, for example, comprise silicon or a fluorine based compound having a low dielectric constant. Contact holes or vias are patterned in the dielectric layer to expose a portion of the metal lines. A film comprising, for example, titanium/ titanium nitride, is formed on the dielectric layer. Additionally, the film is formed on inside surfaces of the contact holes. The contact holes are filled with plugs, such as tungsten. A second electrode layer may be disposed on the dielectric layer and the plugs, thus creating a multilevel interconnect.

These advantages, together with the various ancillary features which will become apparent to those skilled in the art as the following description proceeds, are attained by these novel methods, a preferred embodiment thereof shown with reference to the accompanying drawings, by way of example only, wherein:

BRIEF DESCRIPTION OF THE DRAWINGS

FIG. 8B is a cross sectional view of the semiconductor wafer of FIG. 7B wherein the protective layer between the metal lines and on top of the second barrier layer has been etched and removed from the substrate;

DESCRIPTION OF THE PREFERRED EMBODIMENTS

Figure 1:
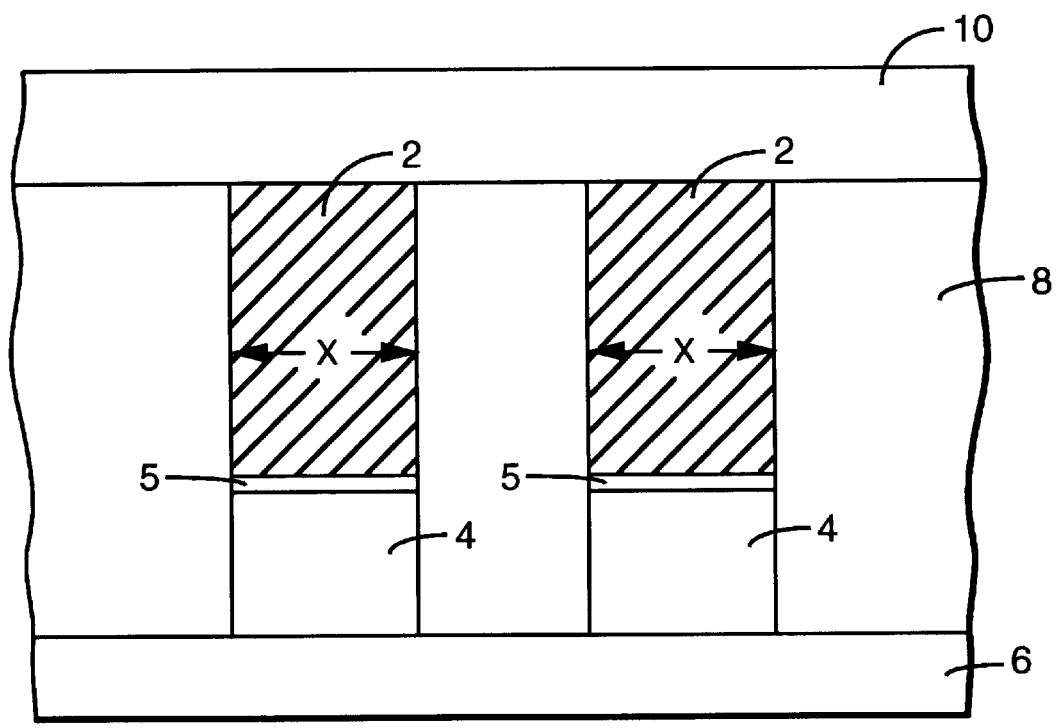
FIG. 1 is a cross sectional view of a multilevel interconnect having contact holes or vias connecting the two levels of interconnect through a dielectric layer, the contact holes or vias are directly aligned with respect to electrodes.
Figure 2:
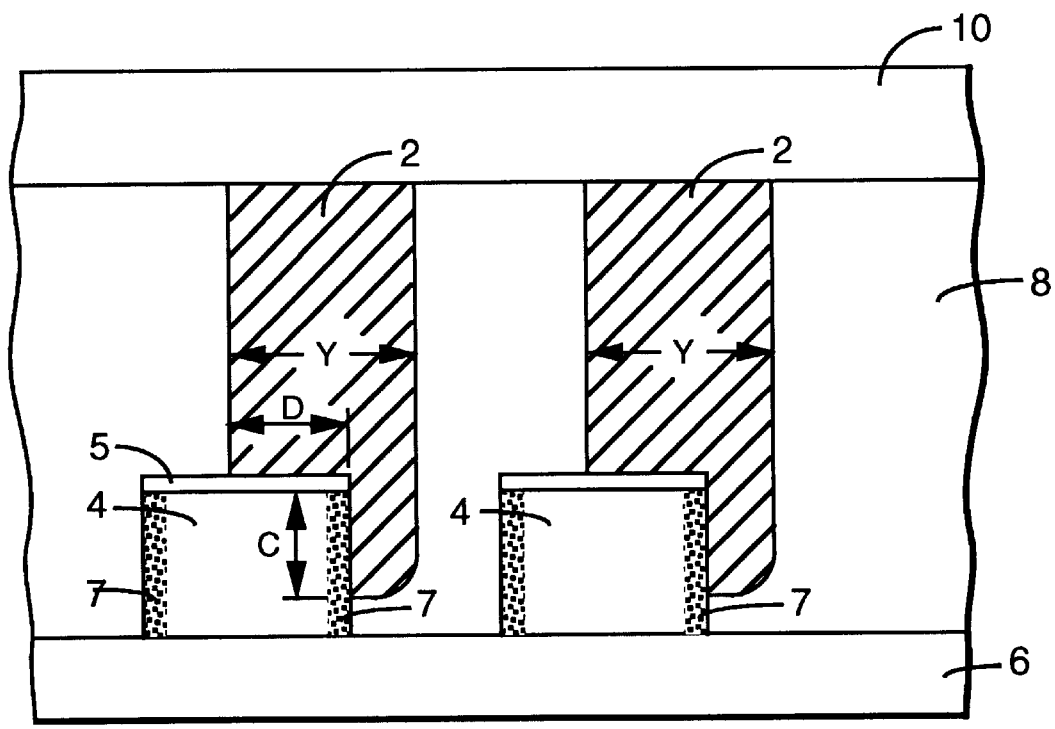
FIG. 2 is a cross sectional view of a multilevel interconnect wherein a resistive film, represented by the shaded area, has reduced the active conductive contact area of electrodes positioned in misaligned or "unlanded" contact holes.
Figure 3A:
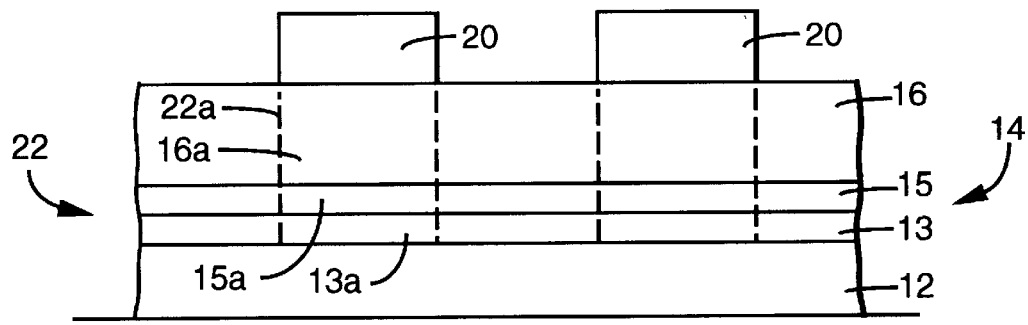
FIG. 3A is a cross sectional view of a semiconductor wafer having a substrate, a first barrier bi-layer disposed on the substrate, an electrode layer disposed on the first barrier bi-layer, and resists disposed on the electrode layer.
Figure 3B:
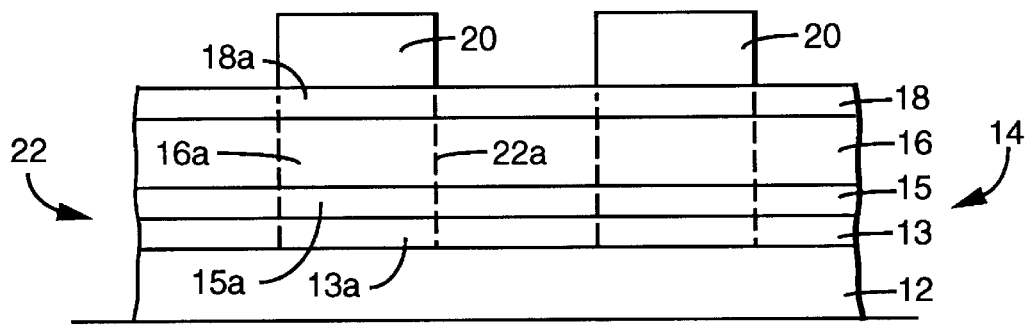
FIG. 3B is a cross sectional view of the semiconductor wafer of FIG. 3A additionally including a second barrier layer disposed on the electrode layer.

Embodiments of the present invention will be described with reference to is the aforementioned figures. These figures have been simplified for ease of understanding and describing the embodiments of the present invention. Referring in detail now to the drawings wherein similar parts of the present invention are identified by like reference numerals, there is seen in FIG. 3A a semiconductor substrate, e.g., silicon substrate, generally illustrated as 12. A first barrier bi-layer is disposed on the substrate 12 and an electrode layer 16 is disposed on the first barrier bi-layer 14. Resists 20 are selectively positioned, i.e., spun, exposed and developed, on the electrode layer 16. In another preferred embodiment of the invention, as shown in FIG. 3B, a second barrier layer 18 is disposed on the electrode layer 16. The first barrier bi-layer 14, the second barrier layer 18 (only in reference to the FIG. 3B embodiment), and the electrode layer 16 can collectively be referred to as a multilayer electrode 22.

The electrode layer 16 may be made of any conductive material and may be of any suitable thickness. Preferably, electrode layer 16 comprises aluminum (Al). The thickness of the Al electrode layer 16 depends on its end use. Typically, the thickness of the Al electrode layer 16 ranges from about 3000 Angstroms to about 8000 and more preferably from about 4500 Angstroms to about 6500 Angstroms. The Al electrode layer 16 may be disposed on the substrate layer 12 by evaporation, dc magnetron sputtering, physical vapor deposition (PVD), or chemical vapor deposition (CVD).

The first barrier bi-layer 14 may be any suitable barrier layer which is capable of functioning as both an adhesive and a diffusion barrier to the Al electrode layer 16. The first barrier bi-layer 14 may be of any suitable thickness. Preferably, the first barrier bi-layer 14 comprises a titanium (Ti) layer 13 and a titanium nitride (TiN) layer 15 disposed on the Ti layer 13. Ti promotes good adhesion as it forms $TiSi_2$ by reacting with the Si of the silicon substrate 12. The use of TiN as a buffer layer between Al—Ti creates excellent thermal stability and contact resistivity ($10^{-6}$ $\Omega$-cm$^2$). The TiN layer 15 may possess, for example, a thickness ranging from about 100 Angstroms to about 300 Angstroms, more preferably from about 200 Angstroms to about 250 Angstroms, and most preferably about 200 Angstroms. The Ti layer 13 may possess a thickness ranging from about 100 Angstroms to about 300 Angstroms, more preferably from about 100 Angstroms to about 150 Angstroms, and most preferably about 100 Angstroms. The Ti layer 13 is preferably disposed on the silicon substrate 12 by physical vapor deposition (PVD). The TiN layer 15 may be disposed on the Ti layer 13 by evaporating the Ti in a $N_2$ ambient, by reactively sputtering the Ti in an $Ar+N_2$ mixture, by sputtering from a TiN target in an inert Ar ambient, by sputter deposing Ti in an Ar ambient and changing it to TiN in a separate plasma nitration step, or by CVD.

The second barrier layer 18 may be any suitable barrier layer which is capable of functioning as an anti-reflective coating and for aluminum hillock suppression upon the aluminum's exposure to high process temperatures. Preferably, second barrier layer 18 comprises TiN and possesses a thickness ranging from about 200 Angstroms to about 1000 Angstroms, more preferably from about 200 Angstroms to about 500 Angstroms, and most preferably about 250 Angstroms. The second barrier layer 18 is formed, for example, by PVD.

The resists 20 (i.e., the photoresist 20) are a light-sensitive organic polymer film which are spun on the multilayer electrode 22, exposed, and developed as is well understood to those skilled in the art. The resists 20 protect the underlying substances from attack during the etching process of the present invention.

Figure 4A:
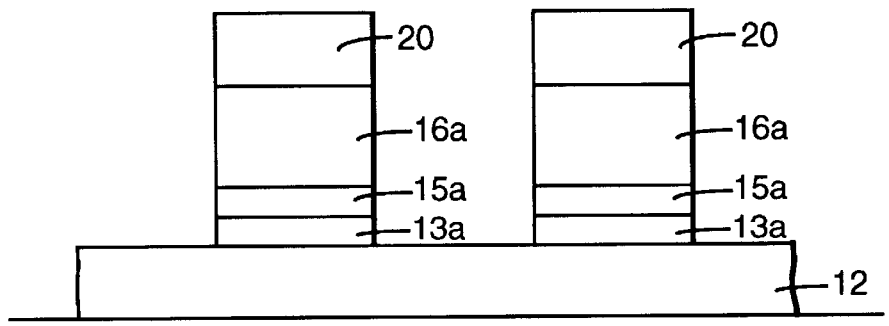
FIG. 4A is a cross sectional view of the semiconductor wafer of FIG. 3A after etching and removing a portion of the electrode layer and the first barrier bi-layer from the surface of the substrate.
Figure 4B:
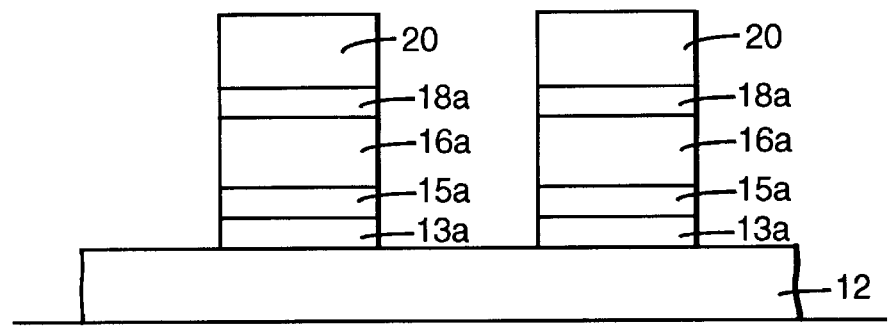
FIG. 4B is a cross sectional view of the semiconductor wafer of FIG. 3B after etching and removing a portion of the second barrier layer, the electrode layer, and the first barrier bi-layer from the surface of the substrate.
Figure 5A:
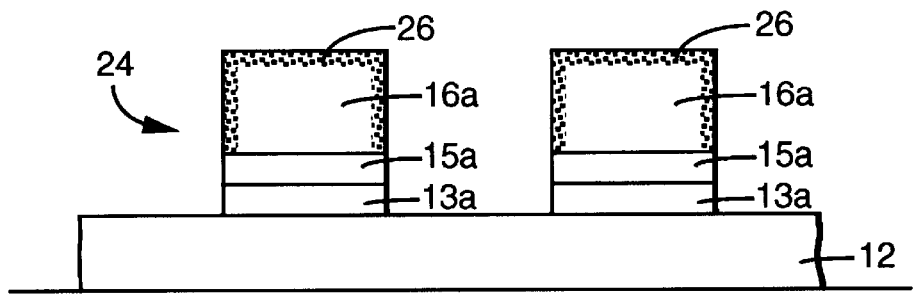
FIG. 5A is a cross sectional view of the semiconductor wafer of FIG. 4A, after the resists have been removed and stripped-off the electrodes to produce metal lines, the metal lines having a resistive film, represented by the shaded area, formed thereon during processing of the metal lines.
Figure 5B:
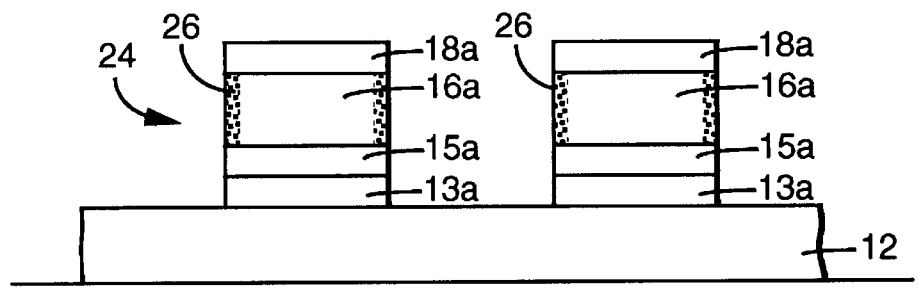
FIG. 5B is a cross sectional view of the semiconductor wafer of FIG. 4B, after the resists have been removed and stripped-off the second barrier layer to produce metal lines, the metal lines having a resistive film, represented by the shaded area, formed thereon during processing of the metal lines.

The structure of FIG. 3A or FIG. 3B is initially placed in a plasma processing apparatus to break through and remove or etch away from the surface of the substrate 12 the multilayer electrode 22, except the multilayer electrode that is below the resists 20, as depicted by dashed lines 22a in FIGS. 3A and 3B. In other words all portions of the Al electrode layer 16, the Ti layer 13, the TiN layer 15, and the TiN layer 18 are removed except for portions 16a, 13a, 15a, and 18a. The result of the etching is illustrated in FIGS. 4A and 4B, respectively. Thereafter, the resists 20 are removed or stripped-off from the surface of the aluminum electrode 16a in FIG. 4A or the TiN layer 18a in FIG. 4B. The result of the resist strip is illustrated in FIGS. 5A and 5B. The plasma processing apparatus may employ any suitable etchant gas to break through (i.e., to clean and etch away) the electrode layer 16, first barrier bi-layer 14, and the second barrier layer 18, except the multilayer electrodes 22a (i.e., metal lines 24) below the resists 20. Such procedure is well known to those skilled in the art.

After the resists 20 have been removed or stripped-off, the metal line 24 profiles are developed, as illustrated in FIGS. 5A and 5B. In processing the metal lines 24, a resistive film such as native oxide, generally illustrated by shaded area 26, is formed on the Al electrode 16a. Native oxide 26 is typically formed when the Al electrode 16a is exposed to either air or oxygen and water desorbed during the etching process. The native oxide 26 impedes the conductivity of the aluminum electrode 16a as it forms an resistive barrier or film.

Figure 6A:
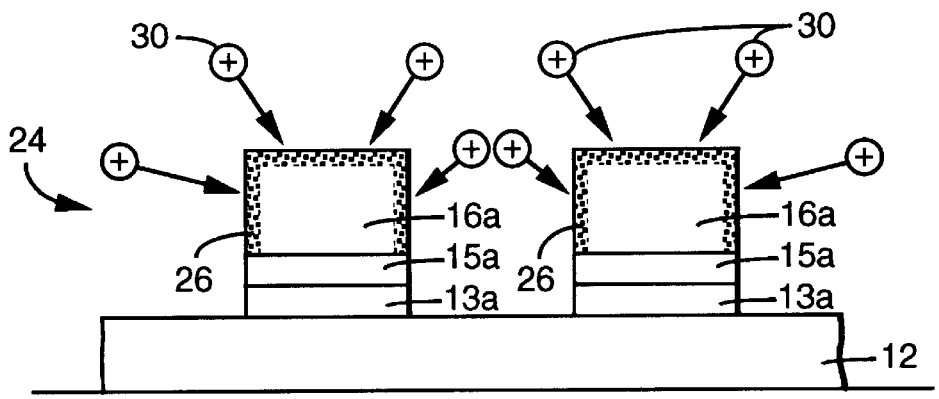
FIG. 6A is a cross sectional view of the semiconductor wafer of FIG. 5A, wherein the metal lines are being bombarded by ion particles to etch and remove the resistive film.
Figure 6B:
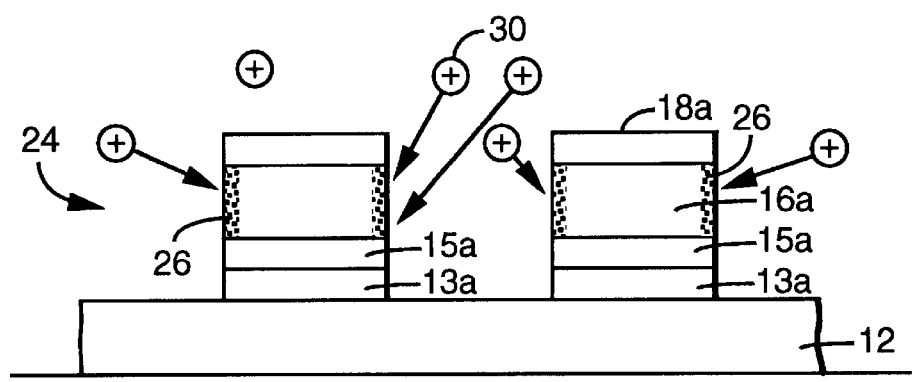
FIG. 6B is a cross sectional view of the semiconductor wafer of FIG. 5B, wherein the metal lines are being bombarded by ion particles to etch and remove the resistive film.

The resistive film 26, e.g., native oxide, is removed from the electrode 16a, e.g., aluminum electrode, by etching the electrode 16a. By preference, the resistive film 26 is sputter etched in a plasma chamber containing a plasma of an etchant gas. The etchant gas is preferably 100% (i.e., greater than about 99.9%) by volume argon. Argon plasma are known to have a high energetic ion concentration and are often used for physical sputtering. The sputtering effect due to the ions is a function of an acceleration potential which exists between the plasma and the sample. In other words, the physical ejection of material occurs when positive ions are propelled into the sample by the negative potentials at the edge of the plasma. As illustrated in FIGS. 6A and 6B, positive ions 30 are accelerated across the sheath and strike the metal lines 24 with high kinetic energy. A portion of this kinetic energy is transferred to surface atoms which are then ejected, causing the physical removal of the resistive film 26, i.e., the native oxide. A low pressure and a long mean-free path are required in the reactor for the material to leave the vicinity of the sample without being back-scattered and redeposited. The substrate 12 is disposed in any one the well known plasma chambers having an inductor and a wafer pedestal and the etching and removing step is performed under the conditions listed in Table I below:

TABLE I

| Process | Broad | Preferred |
| --- | --- | --- |
| Etchant Gas Flow Rate (sccm) | 40 to 100 | 60 |
| Pressure (mTorr) | 3 to 10 | 5 |
| RF Power of Inductor (watts) | 200 to 300 | 225 |
| RF Power of Wafer Pedestal (watts) | 150 to 300 | 200 |
| RF Frequency of Inductor (MHz) | 13.56 to 13.60 | 13.60 |
| RF Frequency of Wafer Pedestal (KHz) | 200 to 600 | 400 |
| Etch Rate of Resistive Film (Å/min) | 200 to 500 | 250 |

Figure 7A:
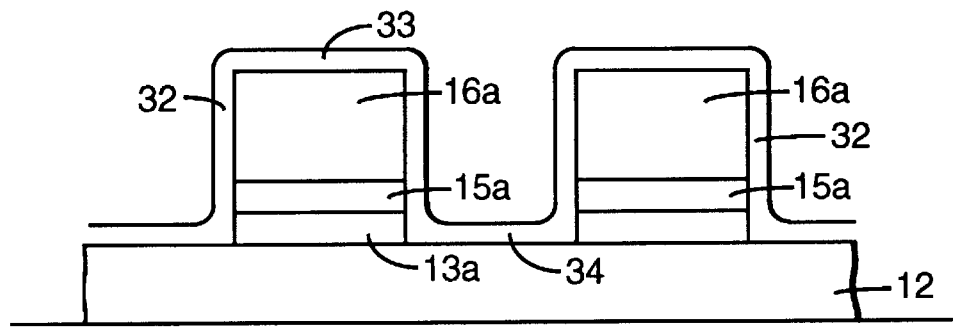
FIG. 7A is a cross sectional view of the semiconductor wafer of FIG. 6A wherein the resistive film has been removed and a protective layer has been formed on the metal lines and the substrate.
Figure 7B:
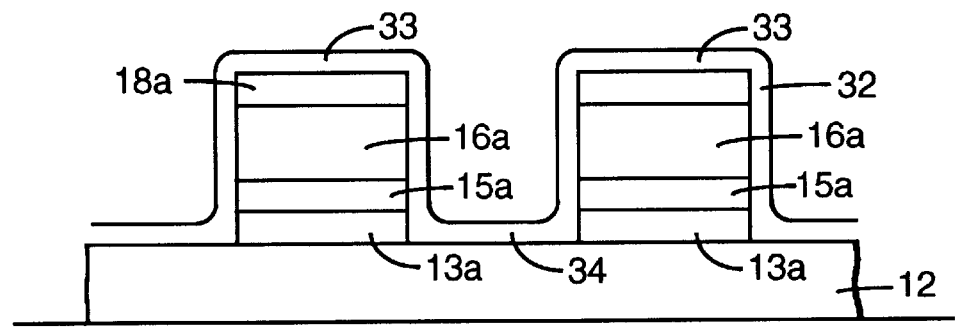
FIG. 7B is a cross sectional view of the semiconductor wafer of FIG. 6B wherein the resistive film has been removed and a protective layer has been formed on the metal lines and the substrate.

After the removal of the resistive film 26, the substrate 12 is transferred under a vacuumed condition to a deposition station within a deposition chamber where a protective layer 32 is formed on the substrate 12 and the metal lines 24, as illustrated by FIG. 7. The protective layer 32 protects the metal lines 24 from a further developing a resistive film. The protective layer 32 may be of any suitable thickness. Protective layer 32 may possess a thickness ranging from about 50 Angstroms to about 200 Angstroms, more preferably from about 50 Angstroms to about 100 Angstroms, and most preferably about 50 Angstroms. Preferably, the protective layer 32 comprises TiN. Alternatively, the protective layer 32 may comprise a Ti/TiN stack. The Ti of the protective layer 32 may be formed by any of the well known PVD methods. The metal lines 24 are heated to a temperature of about 100° C. to about 300° C., preferably about 100. The deposition chamber is pressurized from about 3 mTorr to about 10 mTorr, preferably about 5 mTorr. Argon gases are used in the chamber for physical vapor deposition of a Ti layer on the metal lines 24. Preferably, the TiN of the protective layer 32 may be formed by CVD. The metal lines 24 are heated to a temperature of about 370° C. to about 450°

C., preferably 375° C. The deposition chamber is pressurized from about 500 mTorr to about 1000 mTorr, preferably 700 mTorr. Tetrakis (dimethylamido) titanium (TDMAT) or tetrakis (diethylamido) titanium (TDEAT) is provided at a flow rate of about 200 sccm.

Figure 8A:
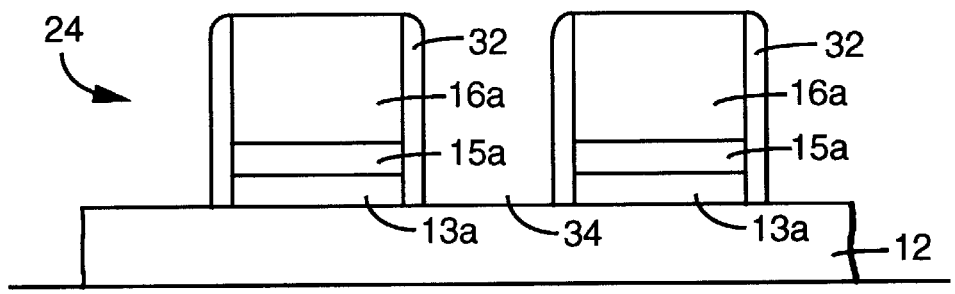
FIG. 8A is a cross sectional view of the semiconductor wafer of FIG. 7A wherein the protective layer between and on top of the metal lines has been etched and removed from the substrate.
Figure 8A:
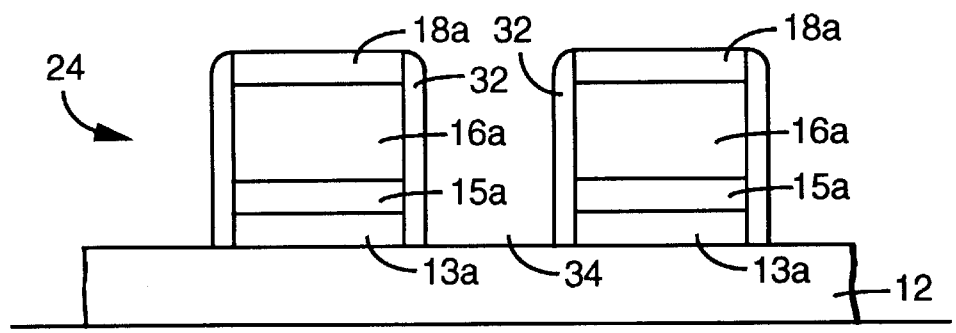

Next, a portion of the protective layer 32 which is formed between the metal lines 24, generally referred as intermediate portion 34, is removed or etched from the substrate 12, the result of which is illustrated in FIGS. 8A and 8B. Moreover, a portion of the protective layer 32 which is formed on top of the electrode 16a (FIG. 7A) or on top of the second barrier layer 18a (FIG. 7B), generally illustrated as top portion 33, is also removed, as shown in FIG. 8A and 8B. The intermediate portion 34 and the top portion 33 of the protective layer 32 are removed in any one of the well known plasma chambers having an inductor and a wafer pedestal and the etching and removing step is performed under the conditions listed in Table II below:

TABLE II

| Process | Parameter |
|---|---|
| Etchant Gas Flow Rate (sccm) | |
| $Cl_2$ | 70 |
| $N_2$ | 50 |
| Pressure (mTorr) | 7 |
| RF Power of Inductor (watts) | 150 |
| RF Power of Wafer Pedestal (watts) | 270 |
| RF Frequency of Inductor (MHz) | 13.56 MHz |
| RF Frequency of Wafer Pedestal (MHz) | 13.56 MHz |
| Over Etch | 50% |

Figure 9:
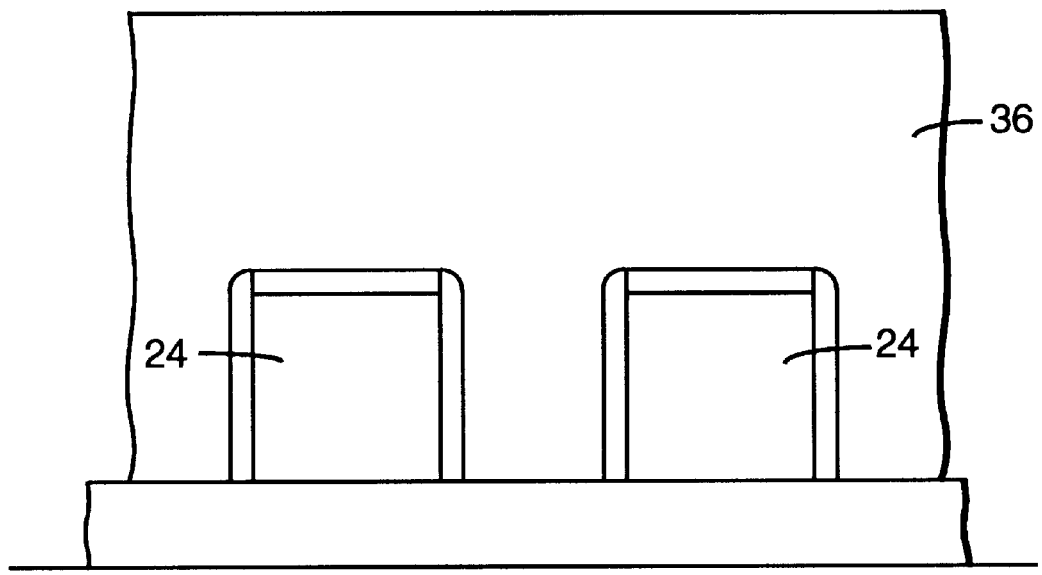
FIG. 9 is a cross sectional view of the semiconductor wafer having the substrate supporting the metal lines, the protective layer formed on the side of the metal lines, and a dielectric layer disposed on the substrate including the metal lines.

Referring to FIG. 9, in order to create a multilevel interconnect, a dielectric layer 36 is formed on the above described substrate layer 12 and metal lines 24. Dielectric layers are used to electrically isolate adjacent levels of conductors. Preferably, the dielectric layer 36 comprises silicon or a fluorine base compound having a low dielectric constant. The dielectric 36 layer possesses a thickness ranging from about 5000 Angstroms to about 10,000 Angstroms, more preferably from about 5000 Angstroms to about 8000 Angstroms, and most preferably about 6500 Angstroms. After the dielectric layer 36 is formed, chemical-mechanical polishing is employed to planarize the dielectric layer 36. Silicon dielectric layers can be deposited by means of a number of CVD processes, including atmospheric CVD or plasma-enhanced CVD, which are well known in the art.

Figure 10:
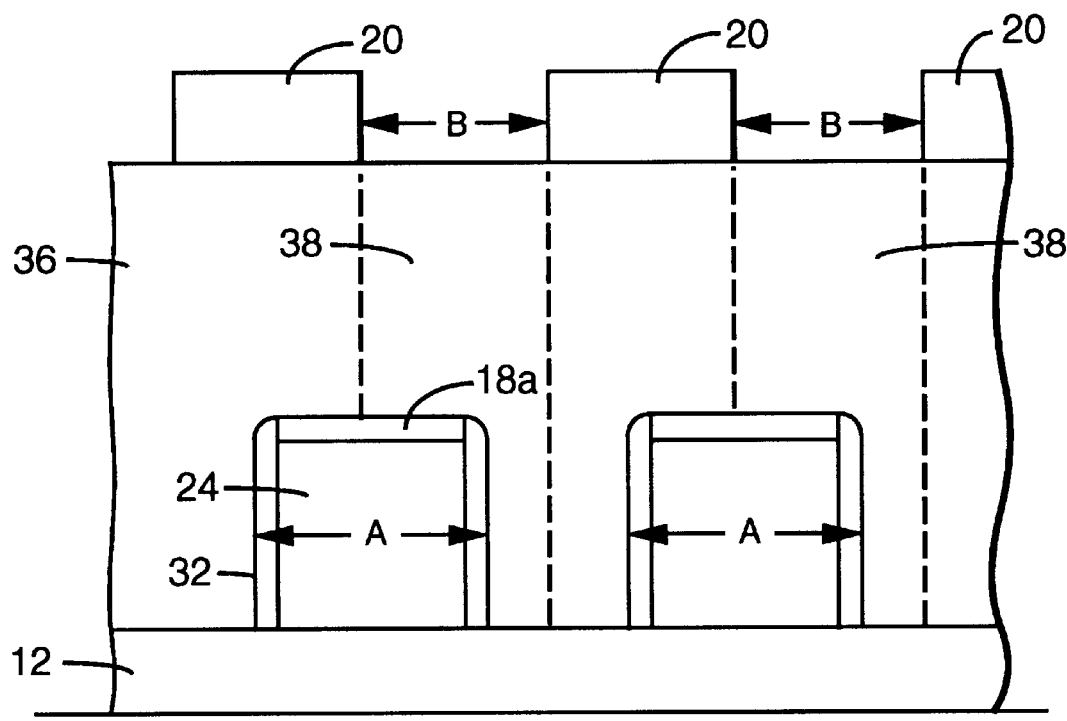
FIG. 10 is a cross sectional view of the semiconductor wafer of FIG. 9 having resists selectively disposed on the dielectric layer for etching contact holes or vias in the dielectric layer, as represented by dashed lines.
Figure 11:
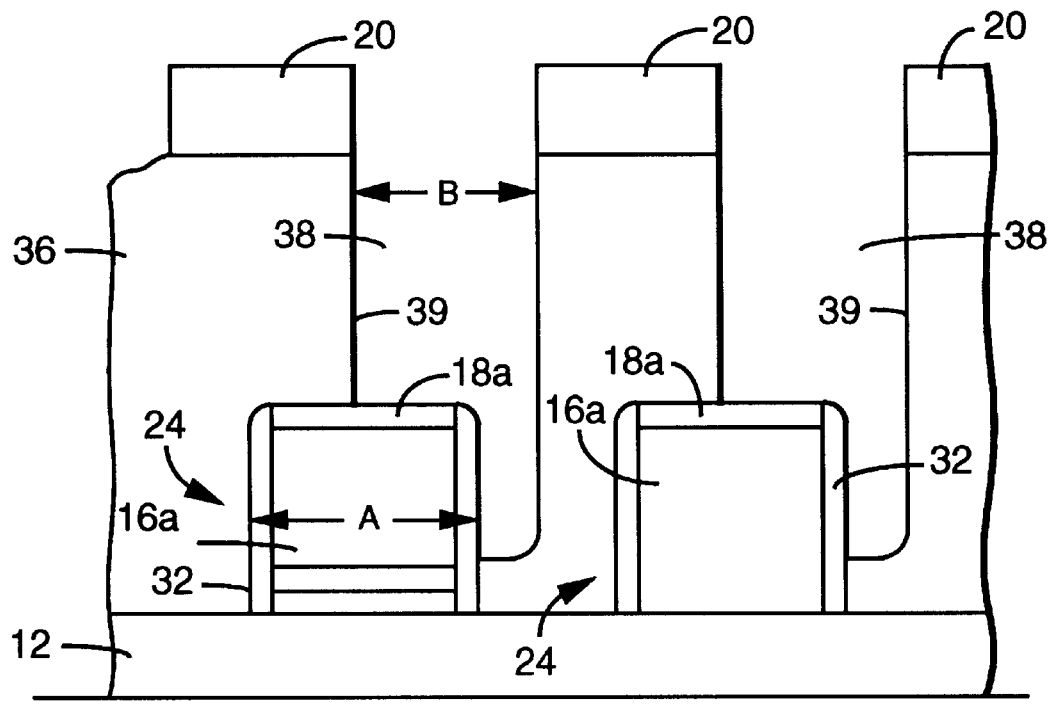
FIG. 11 is a cross sectional view of the semiconductor wafer of FIG. 10 after etching the contact holes or vias in the dielectric layer to expose a portion of the metal lines, the contact holes or vias being misaligned or "unlanded" with respect to the metal lines.
Figure 12:
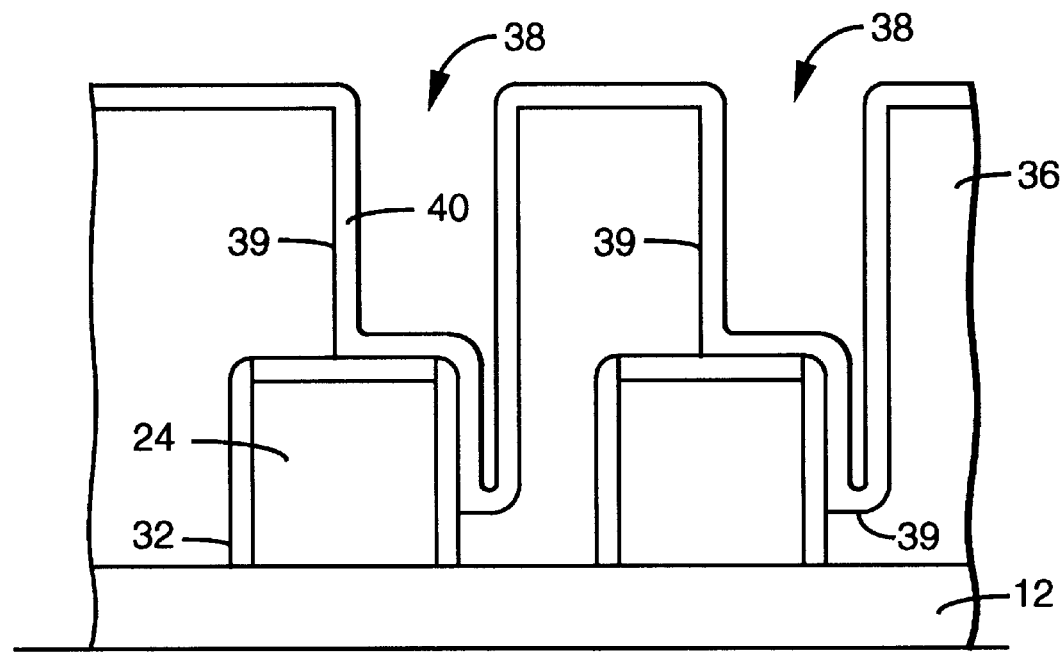
FIG. 12 is a cross sectional view of the semiconductor wafer of FIG. 11 after a film is formed on the dielectric layer including the inside surfaces of the contact holes or vias.
Figure 13:
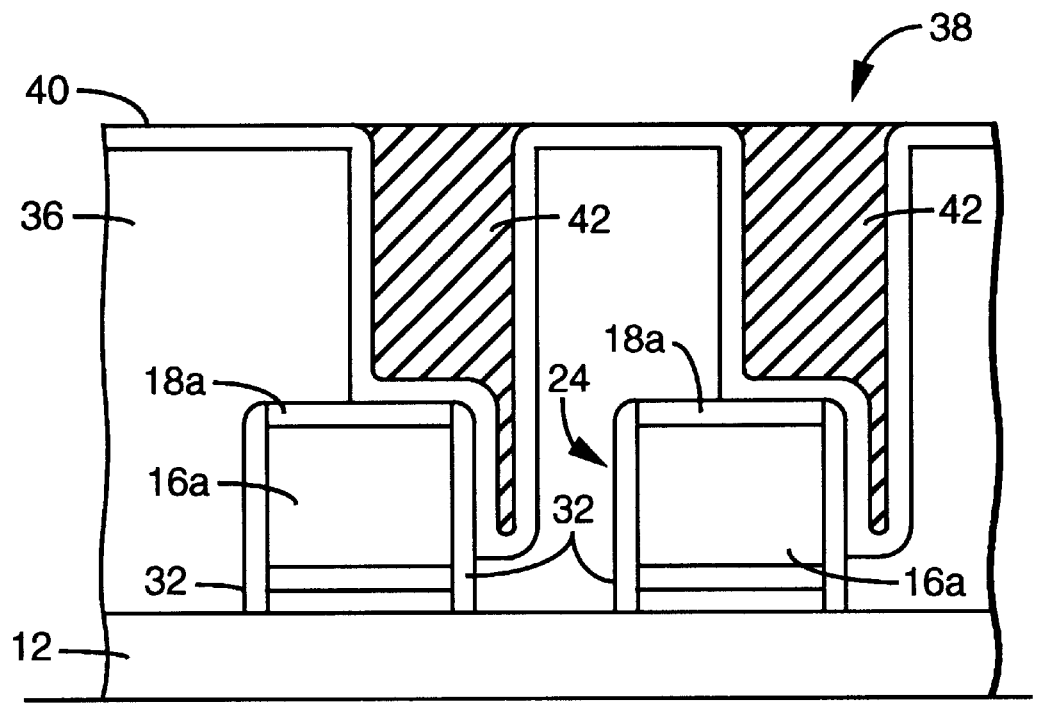
FIG. 13 is a cross sectional view of the semiconductor wafer of FIG. 12 after plugs are formed in the contact holes or vias, the plugs being represented by diagonal lines.

Referring to FIG. 10, resists 20 are selectively placed, i.e., spun, exposed, and developed, on the dielectric layer 36. The portion of the dielectric layer 36 that is not protected by the resists 20 is etched to pattern contact holes or vias 38 in the dielectric layer 36 to expose a portion of the metal lines 24. Resists 20 are placed a distance of B apart from one another. Distance B is equal to width A of the metal lines 24. As a result, the vias 38 will have diameter equal to A or B. As previously discussed in the Background of the Invention section of the application, one of the factors that adversely impacts multilevel interconnects is the misalignment of vias during the via patterning process. In other word the vias 38 do not "land" directly on the metal lines 24, as illustrated in FIG. 11. The vias 38 are commonly shifted and misaligned with respect to the metal lines 24. Resists 20 can be removed during or after the patterning process of the vias 38. Proceeding the removal of the resists 20, as illustrated by FIG. 12, a film 40 is formed on the dielectric layer 36, including inside surfaces 39 of the vias 38. The film 40 also forms over the metal lines 24. The film 40 may comprise any suitable material functioning as an adhesive and a diffusion barrier. Preferably, the film 40 comprises Ti/TiN stack, as this stack promotes adequate adhesion not only for a second electrode layer 44 but also for plugs 42 which are formed in the vias 38 (see FIGS. 13 and 14). The film 40 may be of any suitable thickness. The film 40 can possess a thickness ranging from about 200 Angstroms to about 1000 Angstroms, more preferably from about 200 Angstroms to about 300 Angstroms, and most preferably about 200 Angstroms. The Ti/TiN film 40, may be formed using CVD, PVD, or a combination of both.

Figure 14:
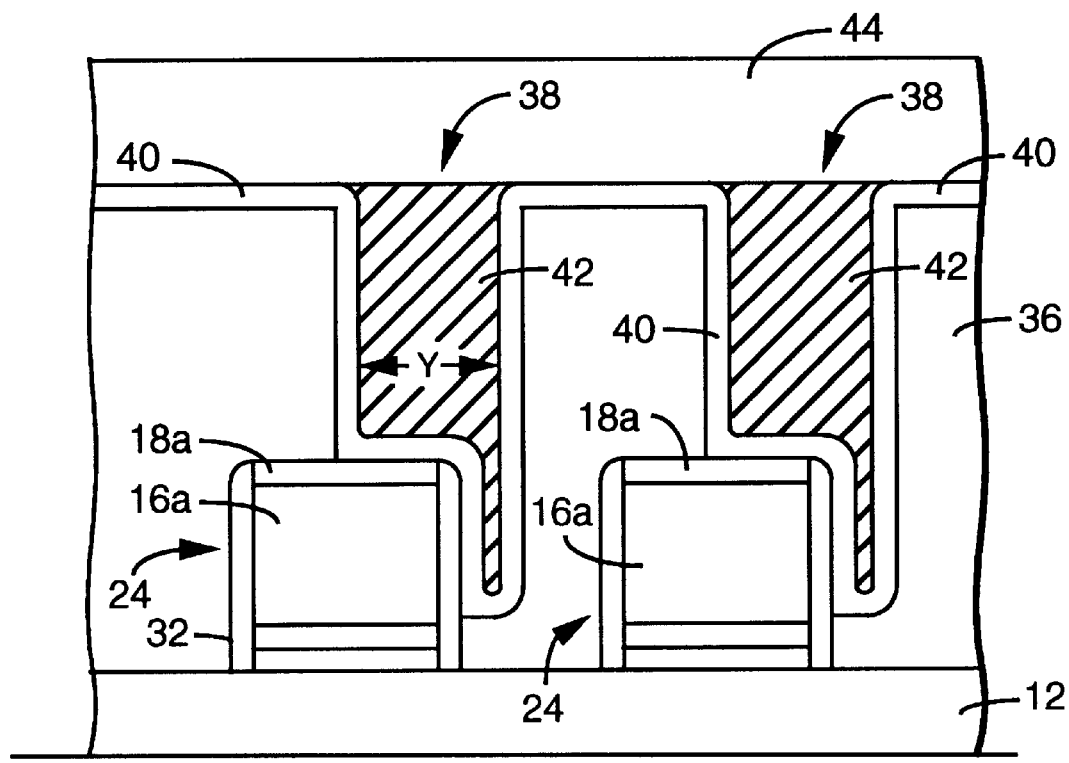
FIG. 14 is a cross sectional view of the semiconductor wafer of FIG. 13 having a second electrode layer disposed on the dielectric layer and the plugs, producing a multilevel interconnect.

After the deposition of the film 40, the vias 39 are filled, through the deposition of metal, to form plugs 42. Preferably, tungsten (W) is used as the plugs 42. CVD techniques have been used to fill the vias 38 with tungsten. Finally, chemical-mechanical polishing or tungsten etch back is used to planarize the dielectric layer 36 and to form the plugs 42. A second electrode layer 44, as illustrated in FIG. 14, can now be disposed, creating a multilevel interconnect.

Thus, while the present invention has been described herein with reference to particular embodiments thereof, a latitude of modifications, various changes and substitutions are intended in the foregoing disclosure, and it will be appreciated that in some instances some features of the invention will be employed without a corresponding use of other features without departing from the scope of the invention as set forth.

We claim:

1. A method for decreasing contact resistance of an electrode, comprising:

a) providing a metal electrode having a resistive film formed thereon;

b) removing said resistive film from said electrode in an environment which prevents formation of a native oxide of said metal electrode; and c) while maintaining said environment, forming a conductive protective layer on said electrode.

2. The method of claim 1, wherein said electrode comprises an aluminum layer supported by a titanium nitride layer.

3. The method of claim 1, wherein said electrode comprises an aluminum layer supported by a titanium/titanium nitride bi-layer.

4. The method of claim 1, wherein said resistive film comprises oxidized aluminum.

5. The method of claim 1, wherein said removing step (b) comprises employing plasma-assisted etching to remove said resistive film.

6. The method of claim 5, wherein said plasma comprises argon.

7. The method of claim 1, additionally comprising, prior to said removing step (b), disposing said electrode in a plasma chamber including an inductor and a wafer pedestal, and employing a plasma of an etchant gas to remove said resistive film under the following conditions:

| Process | Parameter |
|---|---|
| Etchant Gas Flow Rate (sccm) | 40 to 100 |
| Pressure (mTorr) | 3 to 10 |
| RF Power of Inductor (watts) | 200 to 300 |
| RF Power of Wafer Pedestal (watts) | 150 to 300 |
| RF Frequency of Inductor (MHz) | 13.56 to 13.60 |

-continued

| Process | Parameter |
|---|---|
| RF Frequency of Wafer Pedestal (KHZ) | 200 to 600 |
| Etch Rate of Resistive Film (Å/min) | 200 to 500 |

8. The method of claim 7, wherein said etchant gas comprises argon.

9. The method of claim 7, wherein said forming a protective layer of step (c) comprises:
   a) transferring under a vacuumed condition said electrode from said plasma chamber to a deposition station within a deposition chamber;
   b) heating said electrode to a temperature of about 370° C. to about 450° C.;
   c) providing a pressure of about 500 mTorr to about 1000 mTorr in said deposition chamber; and
   d) providing a compound selected from a group consisting of tetrakis(dimethylamido) titanium (TDMAT) or tetrakis (diethylamido) titanium (TDEAT) for chemical vapor deposition of a titanium nitride layer on said electrode.

10. The method of claim 7, wherein said forming a protective layer of step (c) comprises:
    a) transferring under a vacuumed condition said electrode from said plasma chamber to a deposition station within a deposition chamber;
    b) heating said electrode to a temperature of about 100° C. to about 300° C.;
    c) providing a pressure of about 3 mTorr to about 10 mTorr in said deposition chamber; and
    d) providing argon gases in said deposition chamber for physical vapor deposition of a titanium layer on said electrode.

11. The method of claim 10, wherein said forming a protective layer of step (c) additionally comprises:
    a) heating said electrode to a temperature of about 370° C. to about 450° C.;
    b) providing a pressure of about 500 mTorr to about 1000 mTorr in said deposition chamber; and
    c) providing a compound selected from a group consisting of tetrakis(dimethylamido) titanium (TDMAT) or tetrakis (diethylamido) titanium (TDEAT) for chemical vapor deposition of a titanium nitride layer on said titanium layer.

12. A method for producing a conductive structure, including aluminum electrodes comprising:
    a) providing a substrate supporting an aluminum electrode layer;
    b) removing a selected portion of said aluminum electrode layer from said substrate to produce metal lines, said metal lines having native oxide formed thereon during processing of said substrate;
    c) etching said metal lines including employing a plasma of an etchant gas comprising argon to remove said native oxide in an environment which prevents formation of said native oxide; and
    d) while maintaining said environment, forming a protective layer on said metal lines to produce a conductive structure.

13. The method of claim 12, additionally comprising providing a first barrier layer between said substrate and said aluminum electrode layer such that said removing step (b) additionally comprises removing a selected portion of said first barrier layer from said substrate.

14. The method of claim 13, wherein said first barrier layer comprises titanium nitride.

15. The method of claim 13, wherein said first barrier layer comprises titanium/titanium nitride bi-layer.

16. The method of claim 12, additionally comprising providing a second barrier layer on said aluminum electrode layer wherein said removing step (b) additionally comprises removing a selected portion of said second barrier layer from said aluminum electrode layer.

17. The method of claim 16, wherein said second barrier layer comprises titanium nitride.

18. The method of claim 12, additionally comprising, prior to etching step (c), disposing said substrate in a plasma chamber including an inductor and a wafer pedestal, and performing said etching step (c) in said plasma chamber under the following conditions:

| Process | Parameter |
|---|---|
| Argon Gas Flow Rate (sccm) | 40 to 100 |
| Pressure (mTorr) | 3 to 10 |
| RF Power of Inductor (watts) | 200 to 300 |
| RF Power of Wafer Pedestal (watts) | 150 to 300 |
| RF Frequency of Inductor (MHz) | 13.56 to 13.60 |
| RF Frequency of Wafer Pedestal (KHz) | 200 to 600 |
| Etch Rate of Native Oxide (Å/min) | 200 to 500 |

19. The method of claim 18, wherein said forming a protective layer of step (d) comprises:
    a) transferring under a vacuumed condition said metal lines from said plasma chamber to a deposition station within a deposition chamber;
    b) heating said metal lines to a temperature of about 370° C. to about 450° C.;
    c) providing a pressure of about 500 mTorr to about 1000 mTorr in said deposition chamber; and
    d) providing a compound selected from a group consisting of tetrakis(dimethylamido) titanium (TDMAT) or tetrakis (diethylamido) titanium (TDEAT) for chemical vapor deposition of a titanium nitride layer on said metal lines, said compound being provided at a flow rate of 200 sccm.

20. The method of claim 18, wherein said forming a protective layer of step (d) comprises:
    a) transferring under a vacuumed condition said metal lines from said plasma chamber to a deposition station within a deposition chamber;
    b) heating said metal lines to a temperature of about 100° C. to about 300° C.;
    c) providing a pressure of about 3 mTorr to about 10 mTorr in said deposition chamber; and
    d) providing argon gases in said deposition chamber for physical vapor deposition of a titanium layer on said metal lines.

21. The method of claim 20, wherein said forming a protective layer of step (d) additionally comprises:
    a) heating said metal lines to a temperature of about 370° C. to about 450° C.;
    b) providing a pressure of about 500 mTorr to about 1000 mTorr in said deposition chamber; and
    c) providing a compound selected from a group consisting of tetrakis(dimethylamido) titanium (TDMAT) or tetrakis (diethylamido) titanium (TDEAT) for chemical vapor deposition of a titanium nitride layer on said titanium layer, said compound being provided at a flow rate of 200 sccm.

22. The method of claim 12, wherein said forming step (d) additionally comprises removing an intermediate portion of said protective layer formed between said metal lines from said substrate.

23. The method of claim 12, wherein said forming step (d) additionally comprises removing a top portion of said protective layer.

24. The method of claim 12 additionally comprising, subsequent to forming step (d):
   a) forming a dielectric layer on said substrate and said metal lines;
   b) planarizing said dielectric layer;
   c) etching contact holes in said dielectric layer such that said contact holes expose a portion of said metal lines; and
   d) filling said contact holes with a plug.

25. The method of claim 24, wherein said dielectric layer comprises silicon.

26. The method of claim 24, wherein said dielectric layer comprises a fluorine based compound having a low dielectric constant.

27. The method of claim 24, additionally comprising, prior to said filling step (d), forming a film on said dielectric layer such that said film forms on the inside surfaces of said contact holes.

28. The method of claim 27, wherein said film comprises titanium-titanium nitride stack.

29. The method of claim 24, wherein said plug comprises tungsten (W).

30. A method of manufacturing a multilevel interconnect, comprising:
   a) providing a first metal electrode layer on a substrate;
   b) removing a portion of said first metal electrode layer from said substrate to produce metal lines, said metal lines having a resistive film formed thereon during processing of said metal lines;
   c) etching said metal lines including employing a plasma of an etchant gas to remove said resistive film in an environment which prevents formation of said resistive film;
   d) while maintaining said environment forming a protective layer on said substrate and said metal lines, said protective layer having intermediate portions;
   e) etching said intermediate portions of said protective layer to break through and remove said intermediate portions from said substrate;
   f) forming a dielectric layer on said substrate and said metal lines;
   g) etching vias in said dielectric layer to expose a portion of said metal lines;
   h) filling said vias with plugs; and
   i) forming a second electrode layer on said dielectric layer and said plugs to produce a multilevel interconnect.

31. The method of claim 30, wherein said first electrode layer comprises a titanium nitride layer and an aluminum layer disposed on said titanium nitride layer.

32. The method of claim 30, wherein said first electrode layer comprises a titanium layer, a titanium nitride layer disposed on said titanium layer, and an aluminum layer disposed on said titanium nitride layer.

33. The method of claim 30, wherein said first electrode layer comprises a titanium layer, a first titanium nitride layer disposed on said titanium layer, an aluminum layer disposed on said first titanium nitride layer, a second titanium nitride layer disposed on said aluminum layer.

34. The method of claim 30, wherein said resistive film comprises native oxide.

35. The method of claim 30, additionally comprising, prior to etching step (c), disposing said substrate in a plasma chamber including an inductor and a wafer pedestal, and performing said etching step (c) under the following conditions:

| Process | Parameter |
| --- | --- |
| Argon Gas Flow Rate (sccm) | 40 to 100 |
| Pressure (mTorr) | 3 to 10 |
| RF Power of Inductor (watts) | 200 to 300 |
| RF Power of Wafer Pedestal (watts) | 150 to 300 |
| RF Frequency of Inductor (MHz) | 13.56 to 13.60 |
| RF Frequency of Wafer Pedestal (KHz) | 200 to 600 |
| Etch Rate of Resistive Film (Å/min) | 200 to 500 |

36. The method of claim 35, wherein said forming a protective layer of step (d) comprises:
   a) transferring under a vacuumed condition said metal lines from said plasma chamber to a deposition station within a deposition chamber;
   b) heating said metal lines to a temperature of about 370° C. to about 450° C.;
   c) providing a pressure of about 500 mTorr to about 1000 mTorr in said deposition chamber; and
   d) providing a compound selected from a group consisting of tetrakis (dimethylamido) titanium (TDMAT) or tetrakis (diethylamido) titanium (TDEAT) for chemical vapor deposition of a titanium nitride layer on said metal lines.

37. The method of claim 35, wherein said forming a protective layer of step (d) comprises:
   a) transferring under a vacuumed condition said metal lines from said plasma chamber to a deposition station within a deposition chamber;
   b) heating said metal lines to a temperature of about 100° C. to about 300° C.;
   c) providing a pressure of about 3 mTorr to about 10 mTorr in said deposition chamber; and
   d) providing argon gases in said deposition chamber for physical vapor deposition of a titanium layer on said metal lines.

38. The method of claim 37, wherein said forming a protective layer of step (d) additionally comprises:
   a) heating said metal lines to a temperature about 370° C. to about 450° C.;
   b) providing a pressure of about 500 mTorr to about 1000 mTorr in said deposition chamber; and
   c) providing a compound selected from a group consisting of tetrakis(dimethylamido) titanium (TDMAT) or tetrakis (diethylamido) titanium (TDEAT) for chemical vapor deposition of a titanium nitride layer on said titanium layer.

39. The method of claim 30, wherein said dielectric layer comprises silicon.

40. The method of claim 30, wherein said dielectric layer comprises a fluorine based compound having a low dielectric constant.

41. The method of claim 30 additionally comprising, subsequent to said etching step (g), forming a film on said dielectric layer such that said film forms on the inside surfaces of said vias.

42. The method of claim 41, wherein said film comprises titanium-titanium nitride stack.

* * * * *

UNITED STATES PATENT AND TRADEMARK OFFICE
CERTIFICATE OF CORRECTION

PATENT NO. : 6,277,726 B1 Page 1 of 1
DATED : August 21, 2001
INVENTOR(S) : Kitch et al.

It is certified that error appears in the above-identified patent and that said Letters Patent is hereby corrected as shown below:

Column 4,
Line 45, delete "is";
Line 52, after "bi-layer" and insert -- 14 --;

Column 6,
Line 51, after "from" delete "a";

Column 9,
Line 5, delete "KHZ" and insert -- KHz --.

Signed and Sealed this

Eighth Day of April, 2003

JAMES E. ROGAN
*Director of the United States Patent and Trademark Office*